United States Patent
Wenzel et al.

(10) Patent No.: US 11,475,559 B2
(45) Date of Patent: Oct. 18, 2022

(54) ARTIFICIAL INTELLIGENCE-ENABLED LOCALIZATION OF ANATOMICAL LANDMARKS

(71) Applicant: KONINKLIJKE PHILIPS N.V., Eindhoven (NL)

(72) Inventors: Fabian Wenzel, Hamburg (DE); Tom Brosch, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 235 days.

(21) Appl. No.: 16/764,009

(22) PCT Filed: Nov. 16, 2018

(86) PCT No.: PCT/EP2018/081530
§ 371 (c)(1),
(2) Date: May 14, 2020

(87) PCT Pub. No.: WO2019/096981
PCT Pub. Date: May 23, 2019

(65) Prior Publication Data
US 2020/0279371 A1    Sep. 3, 2020

(30) Foreign Application Priority Data

Nov. 17, 2017    (EP) .................................... 17202250

(51) Int. Cl.
*G06T 7/00* (2017.01)
*G06N 20/00* (2019.01)
(Continued)

(52) U.S. Cl.
CPC .......... *G06T 7/0012* (2013.01); *G01R 33/543* (2013.01); *G01R 33/5608* (2013.01);
(Continued)

(58) Field of Classification Search
CPC ......... G06T 7/0012; G06T 2207/10088; G06T 2207/20081; G01R 33/543; G01R 33/5608; G06N 20/00
(Continued)

(56) References Cited

U.S. PATENT DOCUMENTS 8,218,849 B2    7/2012    Lu et al.
8,565,505 B2    10/2013    Bergmans et al.
(Continued)

OTHER PUBLICATIONS

Zhan et al "Robust Automatic Knee MR Slice Positioning Through Redundant and Hierarchical Anatomy Detection" IEEE Transactions on Medical Imaging, vol. 30 No. 12, p. 2087-2100.
(Continued)

*Primary Examiner* — Ajibola A Akinyemi

(57) ABSTRACT

The present disclosure relates to a method for medical imaging method for locating anatomical landmarks of a predetermining defined anatomy. The method comprises: a) providing a machine learning model for predicting anatomical landmarks in image data obtained using a set of acquisition parameters and for predicting a subsequent set of acquisition parameters of the set of acquisition parameters for subsequent acquisition of image data; b) determining 5 a current set of acquisition parameters; c) receiving survey image data representing a slice of the anatomy, the survey image data having the current set of current acquisition parameters; d) identifying anatomical landmarks in the received image data using the machine learning model; e) predicting another set of acquisition parameters using the machine learning model and repeating steps c)-e) for a predefined number of repetitions using the predicted set of 10 acquisition parameters as the current set of parameters; and f) providing the identified anatomical landmarks.

14 Claims, 3 Drawing Sheets

(51) Int. Cl.
 G01R 33/54 (2006.01)
 G01R 33/56 (2006.01)
(52) U.S. Cl.
 CPC .... G06N 20/00 (2019.01); *G06T 2207/10088* (2013.01); *G06T 2207/20081* (2013.01)
(58) Field of Classification Search
 USPC ........................................................ 382/131
 See application file for complete search history.

(56) References Cited

U.S. PATENT DOCUMENTS

| | | | |
|---|---|---|---|
| 9,471,987 B2 | 10/2016 | Harder et al. | |
| 2005/0031082 A1* | 2/2005 | Haaga ..................... | A61B 6/544 378/108 |
| 2005/0113679 A1* | 5/2005 | Suryanarayanan .... | A61B 6/481 382/130 |
| 2005/0251025 A1* | 11/2005 | Hancu .................. | G01R 33/465 600/431 |
| 2009/0154783 A1 | 6/2009 | Bystrov | |
| 2011/0206260 A1 | 8/2011 | Bergmans et al. | |
| 2012/0220855 A1 | 8/2012 | Zhang et al. | |
| 2015/0043774 A1 | 2/2015 | Harder et al. | |
| 2016/0125607 A1 | 5/2016 | Gulaka et al. | |
| 2017/0116497 A1 | 4/2017 | Georgescu et al. | |

OTHER PUBLICATIONS

International Search Report and Written Opinion from PCT/EP2018/081530 dated Apr. 2, 2019.

* cited by examiner

ARTIFICIAL INTELLIGENCE-ENABLED LOCALIZATION OF ANATOMICAL LANDMARKS

CROSS REFERENCE TO RELATED APPLICATIONS

This application is a U.S. national phase application of International Application No. PCT/EP2018/081530 filed on Nov. 16, 2018, which claims the benefit of EP Application Serial No. 17202250.1 filed on Nov. 17, 2017 and is incorporated herein by reference.

FIELD OF THE INVENTION

The invention relates to scanning imaging systems, in particular to a method for locating anatomical landmarks of a predefined anatomy.

BACKGROUND OF THE INVENTION

Magnetic resonance imaging (MRI) plays an increasing role in the assessment of acute neurological diseases like stroke, since it is able to provide diagnostic information with an impact on the choice of therapy. Acquisition of MRI scans usually involves planning as a first step. This step requires acquiring a survey scan, which is then used for scan planning. However, this step involves user interventions and relies on the experience level of the user, which slows down the scan planning.

The US patent application US 2009/0154783 concerns the identification by a radiology technician of anatomically significant landmarks in a sparse scout images to identify the desired anatomically significant coordinate system.

SUMMARY OF THE INVENTION

Various embodiments provide for a method for locating anatomical landmarks of a predefined anatomy, medical analysis system, and computer program product, as described by the subject matter of the independent claims. Advantageous embodiments are described in the dependent claims.

The present disclosure provides a method for a robust and fast detecting of anatomical landmarks by adaptive acquisition. The method may dynamically adapt or drive the acquisition process of the survey scan based on the partial anatomical information already available. For example, the generation of survey magnetic resonance image data may be the basis of (automatic) planning of acquisition of magnetic resonance signals at a high diagnostic spatial resolution. The acquisition of the magnetic resonance data for the survey magnetic resonance images may be done rule based. These rules may automatically be generated using machine learning or artificial intelligence from the identification of anatomical landmarks form previously acquired images.

In one aspect, the invention relates to a medical imaging method for locating anatomical landmarks of a predefined anatomy. The method comprises:

accessing a machine learning model for predicting anatomical landmarks in image data obtained using a set of acquisition parameters and for predicting a subsequent set of acquisition parameters of the set of acquisition parameters for subsequent acquisition of image data;

determining a current set of acquisition parameters;

receiving survey image data representing a slice (or 2D slice) of the anatomy, the survey image data having the current set of current acquisition parameters;

identifying anatomical landmarks in the received survey image data using the machine learning model;

predicting another set of acquisition parameters using the machine learning model and repeating steps c)-e) for a predefined number of repetitions using the predicted set of acquisition parameters as the current set of parameters; and providing the identified anatomical landmarks.

The survey image data may be acquired using an MRI system and the current set of current acquisition parameters. The term "survey scan" refers to a scan for determining imaging conditions and/or data that can be used for image reconstruction etc. and it is performed separately from the clinical or main scan. The survey scan may be performed before the clinical scan. The term "physical scan", "clinical scan" or "main scan" refers to a scan for imaging an intended diagnosis image such as a T1-weighted image, and it does not include a scan for acquiring MR signals for a calibration scan. The clinical scan is performed with a higher image resolution than the calibration scan.

The provided machine learning model that may be accessed by the method of the invention, may be generated using at least one of a classification algorithm and reinforcement algorithm. The machine learning model may predict or select a subsequent set of acquisition parameters using the current set of acquisition parameters and/or the set of acquisition parameters of each iteration of at least part of the previous iterations.

The term "machine learning" refers to a computer algorithm used to extract useful information from training data by building probabilistic models (referred to as machine learning models) in an automated way. The machine learning may be performed using one or more learning algorithms such as linear regression, K-means, classification algorithm, reinforcement algorithm etc. A "model" may for example be an equation or set of rules that makes it possible to predict an unmeasured value (e.g. which tag corresponds to a given token) from other, known values and/or to predict or select an action to maximize a future reward or minimize a future penalty. According to one embodiment, the machine learning model is a deep learning model.

The invention concerns a medical imaging method for locating anatomical landmarks based on machine learning. The medical imaging method of the invention thus involves to access a machine learning model, i.e. a computer algorithm that has been trained from training data. According to the invention the (survey-) image from which the anatomical landmarks are derived is being built-up during the landmark identification. In particular, a survey slice image is received from which landmarks may be detected. In the next iteration acquisition parameters are updated to generate a next survey image from which further anatomical landmarks are identified. The update may be dependent on the anatomical landmarks already identified from previous iterations. This process may continue for a pre-determined number of iterations, which may be defined by a pre-set maximum number of iterations, or the number of iterations that achieves to find a pre-set maximum number of landmarks identified. The identification of (additional) anatomical landmarks from the current survey image slice is carried out by the machine learning model that is inspired to set the next survey slice image acquisition from anatomical landmarks already identified and uses trained rules that may predict further anatomical landmarks form the already identified ones. That is, more and more anatomical landmarks may be identified as further image slices are added. Initially even a survey image slice may not contain any anatomical landmarks that all hat are relevant for the part of the anatomy to be diagnostically imaged. From the image information of that survey image slice the machine learning model may predict a next survey image slice that does contain one or more relevant anatomical landmarks.

The present method may be advantageous as it may enable a fully automated scan planning without interfering with a user's workflow. This may particularly be advantageous as the number and complexity of the images increase and threaten to overwhelm radiologists' capacities to interpret them. The present method may simplify and shorten image acquisition, including the scan planning step. This may, for example, be advantageous in case of a damaged brain tissue in stroke because it has a treatment window of a few hours only which may increase utilization of MRI systems in early stroke or traumatic brain injury.

The present method may enable to automate to a large extent the generation of the (settings for) the survey images to cover the region-of-interest of the patient's anatomy. This may reduce the need for operator intervention for the generation of the survey image.

According to one embodiment, step e) further comprises assigning a confidence level to the identified anatomical landmarks using the machine learning model, wherein the number of repetitions is the number of repetitions required for obtaining the confidence level higher than a predefined threshold. In another example, step d) may further comprise prompting a user for receiving an acknowledgement or non-acknowledgment of the identifier anatomical landmarks, wherein the number of repetitions is the number of repetition until receiving an acknowledgement from the user. The number of repetitions may be higher than or equal to 0.

These embodiments may provide an optimal and controlled process for generating landmarks. The control may be automatic or semi-automatic involving user inputs.

According to one embodiment, the method further comprises providing a training set of image data with a known set of landmarks and multiple sets of acquisition parameters, and executing learning algorithm on the training set for generating the machine learning model. For example the training set may comprise a sequence of annotated images indicating the set of landmarks.

For example, the learning algorithm may comprise a classification and/or reinforcement algorithms. The reinforcement algorithm may for example be configured to learn one or more policies or rules, using the training set, for determining a next set of parameters (action) based on the current set of parameters and/or previously used set of parameters. For example, starting from the current set of parameters and/or previous set of acquisition parameters the machine learning model may follow a policy for a new set of acquisition parameters until it identifies anatomical landmarks with a confidence level higher than the predefined threshold. For example, a reward of the machine learning model may be determined based on the difference between the confidence level and the predefined threshold e.g. the smaller the difference the higher the reward. The policy represents the decision making process of the model at each step e.g. it defines which parameter to change and how to change it, which new parameter to add to the set of parameters etc. The selection of the actions may be optimized by learning based on known landmarks marked on input images in order to maximize the future reward. For example, in case of using the future penalty, a penalty value used by the machine learning model (obtained by reinforcement learning) may increase with each iteration in order to aim at a minimum number of required scanning steps.

According to one embodiment, the training set is indicative of the location of each of the set of landmarks. The location or position of the landmarks may provide an accurate parameter for identifying landmarks in the image data and may thus be suitable for learning process. In another example, the training set may further indicate the voxel or pixel intensity of the set of landmarks.

According to one embodiment, the training set comprises image data representing a 3D volume of the anatomy. The image data may be indicative of the location of the set of landmarks of the anatomy. For example, the image data may be acquired using a 2D multislice acquisition or using a 3D acquisition in order to provide the 3D volume. According to one embodiment, the execution of the learning algorithm comprises determining from the training set image data representing a slice corresponding to a given set of parameters, and executing the learning algorithm using the slice. The image data of the slice may be indicative of the location of the set of landmarks of the anatomy. For example, the machine learning model may comprise a set of rules for choosing the set of parameters and the identification of the landmarks. The set of rules may for example be user defined (e.g. by a technical expert) and/or automatically obtained by machine learning techniques given a set of training scans. For example, arbitrary images for any set of parameters can be extracted from the training scans by planar reformatting with their corresponding ground truth information (e.g. the position of anatomical landmarks, as manually marked by a technician, or as determined by automatic approaches such as SmartExam).

According to one embodiment, the determining from the training set image data representing a slice corresponding to a given set of parameters is performed using a multi-planar reformatting method. For example, the training can be done based on a retrospective dataset of 3D brain scans with known positions for anatomical landmarks. For example, reinforcement training of a deep learning system may be done by applying multi-planar reformatting (MPR) to the 3D brain scan in order to extract a slice matching desired scan parameters (e.g. size, orientation, origin etc.), simulating their acquisition on a scanner. Output variables of the deep learning network are the estimated positions of the anatomical landmarks as well as their confidence level, along with parameters for the next slice which may again be simulated by applying MPR on the dataset.

According to one embodiment, the set of acquisition parameters comprises at least one of the following types: an indication of a slice of the anatomy; voxel size of the image data; number of voxels in the image data; the center of voxel in the image data; the 3D orientation of the slice.

According to one embodiment, the predicted set of parameters comprises different values for the set of parameters and/or modified set of parameter types. The set of acquisition parameters might be extended to include more information, such as the scanning sequence to be used (e.g. T1-TFE, T1-FFE or T2), or acquisition parameters such as echo time (TE) and repetition time (TR). The modified set of parameters may comprise TE, TR and/or flip angle of the image data. This extension may be beneficial if the process of finding anatomical landmarks can be accelerated by multi-contrast analysis.

According to one embodiment, the method further comprises: performing a scan planning of subsequent medical images using the provided anatomical landmarks. The scan planning of the present method may be performed on the fly or dynamically. By means of the present method, scan geometry planning can be made available with a limited burden to the user.

The term "scan geometry" refers to positional information that for example describes the field of view of a medical image relative to an anatomy or relative to the patient's coordinate system. The positional information may be expressed relative to the geometry of the survey scan or relative to anatomical landmarks that are automatically detected in the survey scan.

The term "scan" may include both scans including only a single 2D image frame acquisition pass as well as 3D scanning techniques wherein each individual scan is performed as a time series of individual acquisition passes which are equal in terms of parameters and contrasts. For example, in case the scanning imaging system is a MRI system, the term "scan" may refer to a data acquisition sequence including applying a static magnetic field and a gradient magnetic field, transmitting an RF pulse, receiving an MRI signal, performing a predetermined processing on the NMR signal, and storing the processed MRI signal.

In another aspect, the invention relates to a computer program product comprising machine executable instructions for execution by a processor, wherein execution of the machine executable instructions causes the processor to the methods of any of the preceding embodiments.

In another aspect, the invention relates to a medical analysis system. The medical analysis system comprises: a memory containing machine executable instructions; and a processor for controlling the medical analysis system, wherein execution of the machine executable instructions causes the processor to:

provide a machine learning model for predicting anatomical landmarks in image data obtained using a set of acquisition parameters and for predicting a subsequent set of acquisition parameters of the set of acquisition parameters for subsequent acquiring of image data;

determine a current set of acquisition parameters;

receive survey image data representing a slice of the anatomy, the survey image data having the current set of current acquisition parameters;

identify anatomical landmarks in the acquired image data using the machine learning model;

predict another set of acquisition parameters using the machine learning model; and repeating steps c)-e) for a predefined number of repetitions using the predicted set of acquisition parameters as the current set of parameters;

provide the identified anatomical landmarks.

According to one embodiment, an MRI system is provided. The MRI system comprises medical analysis system and an acquisition component configured to acquire image data such as the survey image data.

It is understood that one or more of the aforementioned embodiments of the invention may be combined as long as the combined embodiments are not mutually exclusive.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

In the following, like numbered elements in the figures are either similar elements or perform an equivalent function. Elements which have been discussed previously will not necessarily be discussed in later figures if the function is equivalent.

Figure 1:
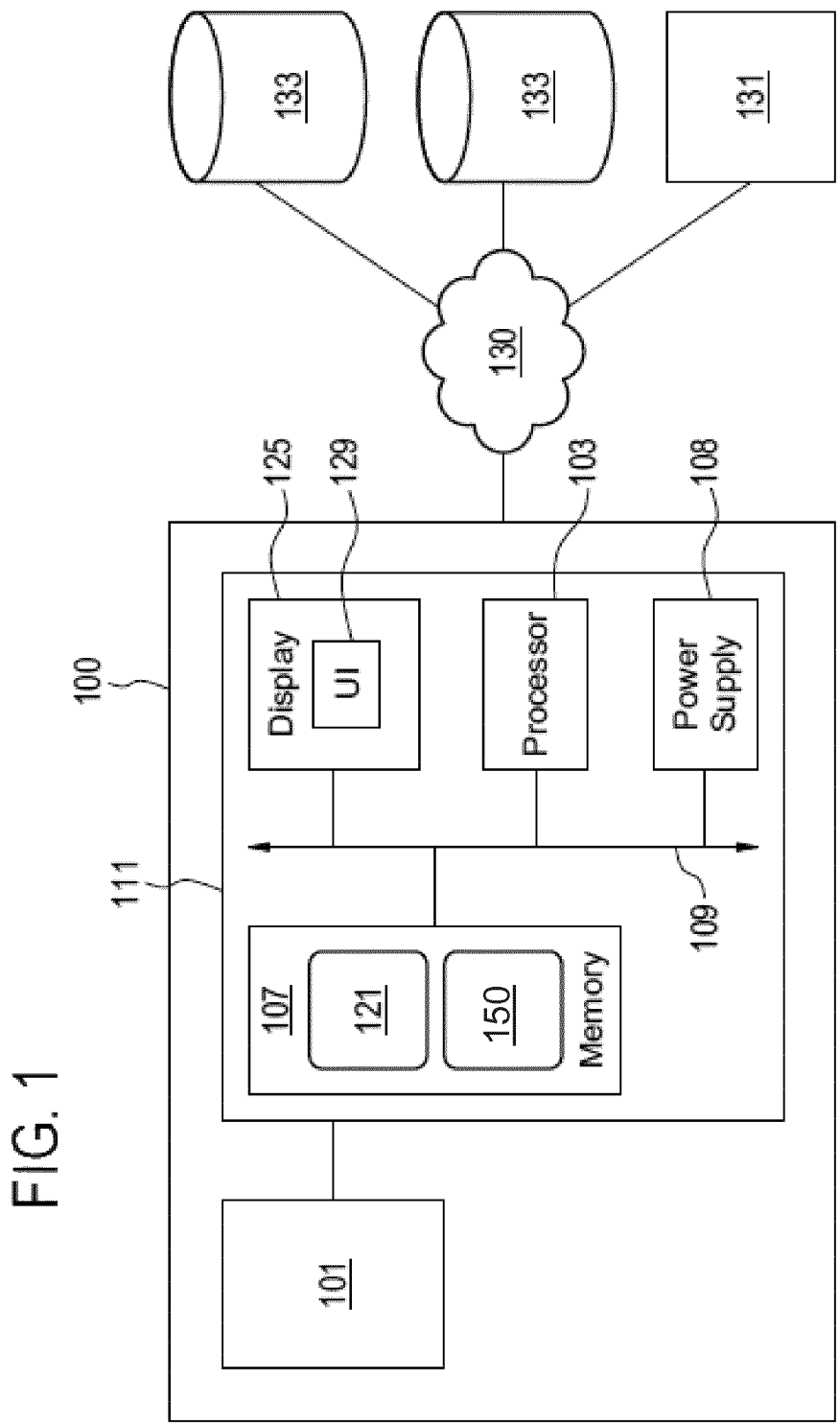
FIG. 1 is a schematic diagram of a medical analysis system.

Various structures, systems and devices are schematically depicted in the figures for purposes of explanation only and so as to not obscure the present invention with details that are well known to those skilled in the art. Nevertheless, the attached figures are included to describe and explain illustrative examples of the disclosed subject matter. FIG. 1 is a schematic diagram of a medical analysis system 100. The medical analysis system 100 comprises a control system 111 that is configured to connect to a scanning imaging system (or acquisition component) 101. The control system 111 comprises a processor 103, a memory 107 each capable of communicating with one or more components of the medical system 100. For example, components of the control system 111 are coupled to a bidirectional system bus 109.

It will be appreciated that the methods described herein are at least partly non-interactive, and automated by way of computerized systems. For example, these methods can further be implemented in software 121, (including firmware), hardware, or a combination thereof. In exemplary embodiments, the methods described herein are implemented in software, as an executable program, and is executed by a special or general-purpose digital computer, such as a personal computer, workstation, minicomputer, or mainframe computer.

The processor 103 is a hardware device for executing software, particularly that stored in memory 107. The processor 103 can be any custom made or commercially available processor, a central processing unit (CPU), an auxiliary processor among several processors associated with the control system 111, a semiconductor based microprocessor (in the form of a microchip or chip set), a microprocessor, or generally any device for executing software instructions. The processor 103 may control the operation of the scanning imaging system 101.

The memory 107 can include any one or combination of volatile memory elements (e.g., random access memory (RAM, such as DRAM, SRAM, SDRAM, etc.)) and non-volatile memory elements (e.g., ROM, erasable programmable read only memory (EPROM), electronically erasable programmable read only memory (EEPROM), programmable read only memory (PROM). Note that the memory 107 can have a distributed architecture, where various components are situated remote from one another, but can be accessed by the processor 103. Memory 107 may store an instruction or data related to at least one other constituent element of the medical system 100.

The control system 111 may further comprise a display device 125 which displays characters and images and the like e.g. on a user interface 129. The display device 125 may be a touch screen display device.

The medical analysis system 100 may further comprise a power supply 108 for powering the medical analysis system 100. The power supply 108 may for example be a battery or an external source of power, such as electricity supplied by a standard AC outlet.

The scanning imaging system 101 may comprise at least one of MRI, CT and PET-CT imagers. The control system 111 and the scanning imaging system 101 may or may not be an integral part. In other terms, the control system 111 may or may not be external to the scanning imaging system 101.

Figure 3:
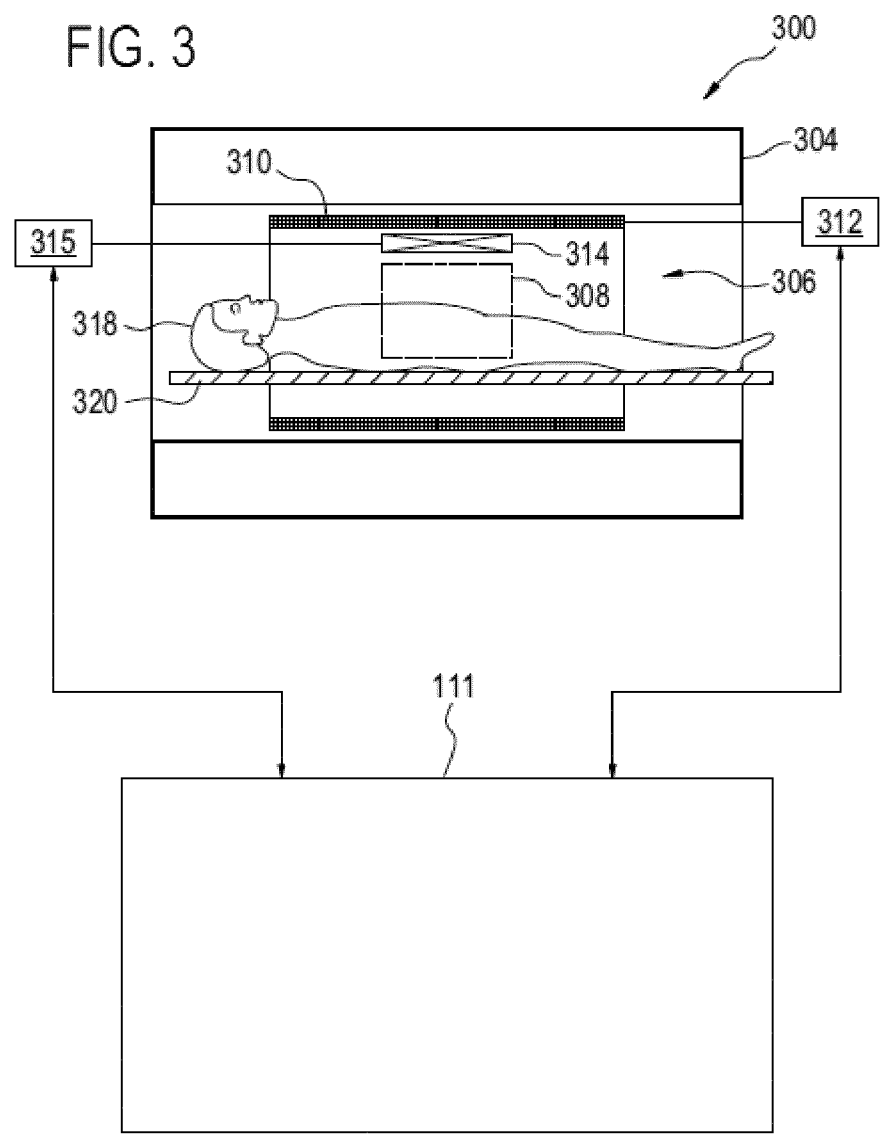
FIG. 3 shows a cross-sectional and functional view of an MRI system.

The scanning imaging system 101 comprises components that may be controlled by the processor 103 in order to configure the scanning imaging system 101 to provide image data to the control system 111. The configuration of the scanning imaging system 101 may enable the operation of the scanning imaging system 101. The operation of the scanning imaging system 101 may for example be automatic. FIG. 3 shows example of components of the scanning imaging system 101 being an MRI system.

The connection between the control system 111 and the scanning imaging system 101 may for example comprise a BUS Ethernet connection, WAN connection, Internet connection etc.

In one example, the scanning imaging system 101 may be configured to provide output data such as images in response to a specified measurement. The control system 111 may be configured to receive data such as survey image data from the MRI scanning imaging system 101. For example, the processor 103 may be adapted to receive information (automatically or upon request) from the scanning imaging system 101 in a compatible digital form so that such information may be displayed on the display device 125. Such information may include operating parameters, alarm notifications, and other information related to the use, operation and function of the scanning imaging system 101. The medical analysis system 100 may be configured to communicate via a network 130 with other scanning imaging systems 131 and/or databases 133. The network 130 comprises for example a wireless local area network (WLAN) connection, WAN (Wide Area Network) connection LAN (Local Area Network) connection or a combination thereof. The databases 133 may comprise information relates to patients, scanning imaging systems, anatomies, scan geometries, scan parameters, scans etc. The databases 133 may for example comprise an EMR database comprising patients' EMR, Radiology Information System database, medical image database, PACS, Hospital Information System database and/or other databases comparing data that can be used for planning a scan geometry. The databases 133 may for example comprise training sets used for generating machine learning models. Additionally or alternatively the training sets may be stored in a local storage (e.g. disk storage or memory) of the control system 111.

The memory 107 may further comprise an artificial intelligence (AI) component 150. The component 150 may or may not be part of software component 121. The AI component 150 may be configured for a robust and fast detecting of anatomical landmarks by adaptive acquisition. The AI component 150 as further described herein may be configured to dynamically adapt/drive the acquisition process of the survey scan based on the partial anatomical information already available, and therefore reducing the number of required images and, consequently, overall scan time for localizing anatomical landmarks required for fully-automated scan planning.

The AI component 150 may be configured for suggesting or predicting a strategic set of parameters for a new image given a set of available images (with their scan parameters) which have already been scanned.

The AI component 150 may be configured to perform machine learning on training sets in order to generate one or more machine learning models for predicting anatomical landmarks in image data obtained using a set of acquisition parameters and for predicting a subsequent set of acquisition parameters of the set of acquisition parameters for subsequent acquiring of image data. The training process may be configured using known methods.

Figure 2:
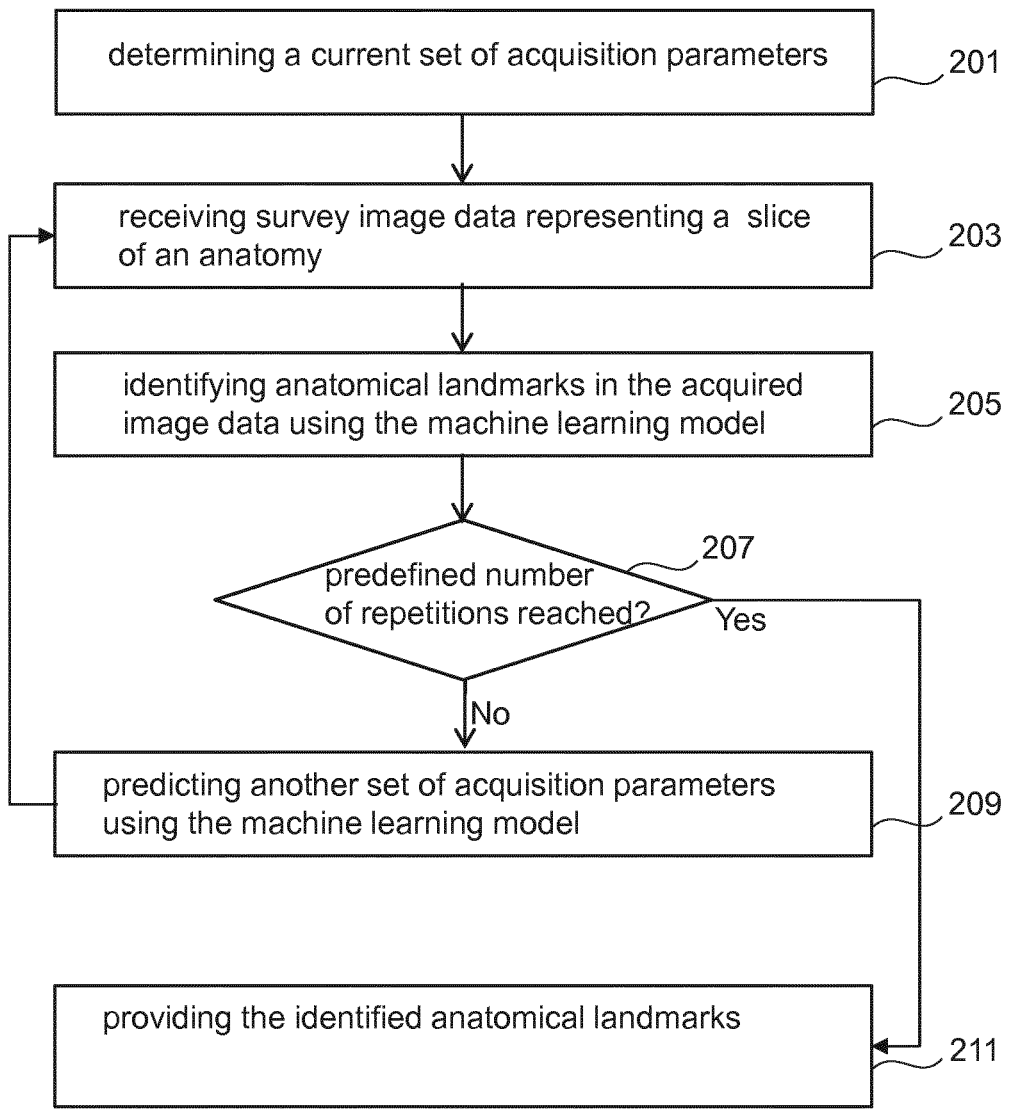
FIG. 2 is a flowchart of a method for locating anatomical landmarks of a predefined anatomy.

FIG. 2 is a flowchart of a method for locating anatomical landmarks of a predefined anatomy (or anatomical structure) using a scanning imaging system e.g. an MRI scanning imaging system. The anatomy may be part of a subject (e.g. 318 of FIG. 3) to be imaged. The anatomy may for example be a heart, brain, knee, spine, shoulder, breast, etc. The imaging of the anatomy may result in images that can be used to perform further actions such as treatment delivery.

In step 201, a current set of acquisition parameters may be determined. The current set of parameters may for example be determined by the control system 111. For example, the set of acquisition parameters may comprise at least one of: number of voxels in X- and Y-direction, the voxel size in mm, the center of voxel (0,0) in DICOM patient coordinates using for example DICOM Tag "ImagePositionPatient", and 3D orientation of the slice in DICOM patient coordinates using for example DICOM Tag: "ImageOrientationPatient". DICOM stands for Digital Imaging and Communications in Medicine.

In step 203, survey image data representing a slice of the anatomy may be received e.g. at the control system 111. For example, the receiving of the survey image data may automatically be performed. In another example, the control system 111 may be configured to control an MRI system in order to acquire the survey image data using the current set of acquisition parameters. The acquisition of the survey image data comprises the acquisition of survey magnetic resonance data from the anatomy by controlling the MRI system with survey pulse sequence data. The survey pulse sequence data comprises instructions for controlling the MRI system to acquire magnetic resonance data descriptive of a slice of the anatomy according to a survey scan geometry.

In step 205, anatomical landmarks may be identified in the acquired image data using the machine learning model. For example, a confidence level may be assigned to the identified anatomical landmarks. For example, the acquired image data may be input to the machine learning model. The identified landmarks may for example correspond to at least part of the set of landmarks that have been used for the generation of the machine learning model. For example, if the set of landmarks of the training set comprises 10 landmarks having respective position p1-p10, the identified landmarks may comprise 5 landmarks having respective positions k1-k5 and that correspond to the landmark positions p1-p5. This correspondence may be quantified by the confidence level.

In case (inquiry step 207) a predefined number of repetitions is reached (or in case a stopping criteria is fulfilled) the identified anatomical landmarks may be provided in step 211; otherwise another set of acquisition parameters may be predicted in step 209 using the machine learning model; and steps 203)-211) may be repeated using the predicted set of acquisition parameters as the current set of parameters.

The prediction of the set of acquisition parameters may be performed using survey image data and the set of parameters of one or more previous iterations. For example, the acquisition parameters described above may be determined for a nth 2D image given the (n−1) 2D images and their scan parameters (or a fixed set of e.g. the most recent images) which have already been acquired. For example, the prediction of set of acquisition parameters may comprise extending the current set of acquisition parameters to include more information, such as the scanning sequence to be used (e.g. T1-TFE, T1-FFE, T2, . . . ), or acquisition parameters such as TE and TR. This extension may be beneficial if the process of finding anatomical landmarks can be accelerated by multi-contrast analysis.

The number of repetitions may be defined as the number of repetitions required to obtain the confidence level higher than a predefined threshold (e.g. 80%) or the stopping criteria may require that the confidence level higher than the predefined threshold.

FIG. 3 illustrates a magnetic resonance imaging system 300 as an example of the medical system 100. The magnetic resonance imaging system 300 comprises a magnet 304. The magnet 304 is a superconducting cylindrical type magnet with a bore 306 in it. The use of different types of magnets is also possible; for instance, it is also possible to use both a split cylindrical magnet and a so called open magnet. A split cylindrical magnet is similar to a standard cylindrical magnet, except that the cryostat has been split into two sections to allow access to the iso-plane of the magnet. Such magnets may for instance be used in conjunction with charged particle beam therapy. An open magnet has two magnet sections, one above the other with a space in-between that is large enough to receive a subject 318 to be imaged, the arrangement of the two sections area similar to that of a Helmholtz coil. Inside the cryostat of the cylindrical magnet there is a collection of superconducting coils. Within the bore 306 of the cylindrical magnet 304 there is an imaging zone or volume or anatomy 308 where the magnetic field is strong and uniform enough to perform magnetic resonance imaging.

Within the bore 306 of the magnet there is also a set of magnetic field gradient coils 310 which is used during acquisition of magnetic resonance data to spatially encode magnetic spins of a target volume within the imaging volume or examination volume 308 of the magnet 304. The magnetic field gradient coils 310 are connected to a magnetic field gradient coil power supply 312. The magnetic field gradient coils 310 are intended to be representative. Typically, magnetic field gradient coils 310 contain three separate sets of coils for the encoding in three orthogonal spatial directions. A magnetic field gradient power supply supplies current to the magnetic field gradient coils. The current supplied to the magnetic field gradient coils 310 is controlled as a function of time and may be ramped or pulsed.

MRI system 300 further comprises an RF coil 314 at the subject 318 and adjacent to the examination volume 308 for generating RF excitation pulses. The RF coil 314 may include for example a set of surface coils or other specialized RF coils. The RF coil 314 may be used alternately for transmission of RF pulses as well as for reception of magnetic resonance signals e.g., the RF coil 314 may be implemented as a transmit array coil comprising a plurality of RF transmit coils. The RF coil 314 is connected to one or more RF amplifiers 315. Elements 304-315 and 320 may form an acquisition component of the MRI system 300.

The magnetic field gradient coil power supply 312 and the RF amplifier 315 are connected to a hardware interface of control system 111. The memory 107 of control system 111 may for example comprise a control module. The control module contains computer-executable code which enables the processor 103 to control the operation and function of the magnetic resonance imaging system 300. It also enables the basic operations of the magnetic resonance imaging system 300 such as the acquisition of magnetic resonance data.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a 'circuit', 'module' or 'system'. Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example, a data may be retrieved over a modem, over the internet, or over a local area network. Computer executable code embodied on a computer readable medium may be transmitted using any appropriate medium, including but not limited to wireless, wireline, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

A 'computer memory' or 'memory' is an example of a computer-readable storage medium. A computer memory is any memory which is directly accessible to a processor. A 'computer storage' or 'storage' is a further example of a computer-readable storage medium. A computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising 'a processor' should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object-oriented programming language such as Java, Smalltalk, C++ or the like and conventional procedural programming languages, such as the 'C' programming language or similar programming languages and compiled into machine executable instructions. In some instances, the computer executable code may be in the form of a high-level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block or a portion of the blocks of the flowchart, illustrations, and/or block diagrams, can be implemented by computer program instructions in form of computer executable code when applicable. It is further understood that, when not mutually exclusive, combinations of blocks in different flowcharts, illustrations, and/or block diagrams may be combined. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device'. A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, gear sticks, steering wheel, pedals, wired glove, dance pad, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bistable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word 'comprising' does not exclude other elements or steps, and the indefinite article 'a' or 'an' does not exclude a plurality. A single processor or other unit may fulfil the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 medical system
101 scanning imaging system
103 processor
107 memory
108 power supply
109 bus
111 control system
121 software
125 display
129 user interface
150 AI component
201-211 method steps
300 magnetic resonance imaging system
304 magnet
306 bore of magnet
308 imaging zone
310 magnetic field gradient coils
312 magnetic field gradient coil power supply
314 radio-frequency coil
315 RF amplifier
318 subject.

The invention claimed is:

1. A medical imaging method for locating anatomical landmarks of a predefined anatomy, the method comprising:
  a) accessing a machine learning model for predicting anatomical landmarks in image data obtained using a set of acquisition parameters and for predicting a subsequent set of acquisition parameters of the set of acquisition parameters for subsequent acquisition of image data;
  b) determining a current set of acquisition parameters;
  c) receiving survey image data representing a slice of the anatomy, the survey image data having the current set of current acquisition parameters;
  d) identifying anatomical landmarks in the received survey image data using the machine learning model;
  e1) predicting using the machine learning model additional anatomical landmarks from the already identified anatomical landmarks
  e2: predicting a next survey image slice using the machine learning model containing one or more relevant anatomical landmarks and
  e3) predicting another set of acquisition parameters for the predicting next survey image slice using the machine learning model and repeating steps c)-e1 to 3) for a predefined number of repetitions using the predicted set of acquisition parameters as the current set of parameters; and
  providing the identified anatomical landmarks.

2. The method of claim 1, step e) further comprising assigning a confidence level to the identified anatomical landmarks using the machine learning model, wherein the number of repetitions is the number of repetitions required for obtaining the confidence level higher than a predefined threshold.

3. The method of claim 1, further comprising providing a training set of image data with a known set of landmarks and multiple sets of acquisition parameters, and executing learning algorithm on the training set for generating the machine learning model.

4. The method of claim 3, wherein the training set is indicative of the location of each of the set of landmarks.

5. The method of claim 3, wherein the training set comprises image data representing a 3D volume of the anatomy.

6. The method of claim 3, wherein executing of the learning algorithm comprises determining from the training set image data representing a slice corresponding to a given set of parameters, and executing the learning algorithm on the slice.

7. The method of claim 6, wherein the determining from the training set image data representing a slice corresponding to a given set of parameters is performed using a multi-planar reformatting method.

8. The method of claim 1, wherein the set of acquisition parameters comprises at least one of the following types:
  an indication of a slice of the anatomy;
  voxel size of the image data;
  number of voxels in the image data;
  the center of voxel in the image data; or
  the 3D orientation of the slice.

9. The method of claim 1, wherein the machine learning model is a deep learning model.

10. The method of claim 1, wherein the predicted set of parameters comprises different values for the set of parameters and/or modified set of parameter, the modified set of parameters may comprise echo time (TE), repetition time (TR), and/or flip angle of the image data.

11. The method of claim 1, further comprising: performing a scan planning of subsequent medical images using the provided anatomical landmarks.

12. A non-transitory computer readable medium comprising machine executable instructions stored thereon that when executed by a processor, causes the processor to perform the method of claim 1.

13. A medical analysis system, comprising: a memory containing machine executable instructions; and a processor for controlling the medical analysis system, wherein execution of the machine executable instructions causes the processor to:
  a) access a machine learning model for predicting anatomical landmarks in image data obtained using a set of acquisition parameters and for predicting a subsequent set of acquisition parameters of the set of acquisition parameters for subsequent acquiring of image data;
  b) determine a current set of acquisition parameters;
  c) receive survey image data representing a slice of the anatomy, the survey image data having the current set of current acquisition parameters;
  d) identify anatomical landmarks in the acquired survey image data using the machine learning model;
  e1) predict using the machine learning model additional anatomical landmarks from the already identified anatomical landmarks
  e2) predicting a next survey image slice using the machine learning model containing one or more relevant anatomical landmarks
  e3) predict another set of acquisition parameters for the predicted next survey image slice using the machine learning model; and repeating steps c)-e1 to 3) for a predefined number of repetitions using the predicted set of acquisition parameters as the current set of parameters; and provide the identified anatomical landmarks.

14. A magnetic resonance imaging (MRI) system comprising the medical analysis system of claim 13, wherein the MRI system is configured to acquire the survey image data.

* * * * *